US012787708B2

(12) United States Patent
Yoo et al.

(10) Patent No.: US 12,787,708 B2
(45) Date of Patent: Nov. 3, 2026

(54) ADHESIVE TAPE SHEET, METHOD OF MANUFACTURING THE SAME AND METHOD OF MANUFACTURING SEMICONDUCTOR DEVICES USING THE SAME

(71) Applicant: Samsung Electronics Co., Ltd., Suwon-si (KR)

(72) Inventors: Hansol Yoo, Suwon-si (KR); Wonkeun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 539 days.

(21) Appl. No.: 18/232,589

(22) Filed: Aug. 10, 2023

(65) Prior Publication Data

US 2024/0079260 A1 Mar. 7, 2024

(30) Foreign Application Priority Data

Sep. 6, 2022 (KR) ........................ 10-2022-0112780

(51) Int. Cl.
*H10P 72/70* (2026.01)
*C09J 7/20* (2018.01)
*H10P 72/00* (2026.01)

(52) U.S. Cl.
CPC ............ *H10P 72/7402* (2026.01); *C09J 7/20* (2018.01); *H10P 72/0442* (2026.01); *C09J 2203/326* (2013.01); *H10P 72/7416* (2026.01)

(58) Field of Classification Search
CPC ........... H01L 21/6836; H01L 21/67132; H01L 2221/68327; H01L 2221/68318; C09J 7/20; C09J 2203/326
See application file for complete search history.

(56) References Cited

U.S. PATENT DOCUMENTS

| | | | | |
|---|---|---|---|---|
| 8,470,115 B2 | 6/2013 | Tanaka et al. | | |
| 9,190,309 B2 | 11/2015 | Taniguchi et al. | | |
| 9,631,123 B2 | 4/2017 | Aoyama et al. | | |
| 2015/0017373 A1* | 1/2015 | Aoyama | C09J 7/20 | 428/41.8 |

(Continued)

FOREIGN PATENT DOCUMENTS

| | | | |
|---|---|---|---|
| JP | 2005-162818 A | 6/2005 | |
| JP | 4495916 B2 | 7/2010 | |

(Continued)

*Primary Examiner* — Scott R. Walshon
(74) *Attorney, Agent, or Firm* — Sughrue Mion, PLLC

(57) ABSTRACT

An adhesive tape sheet includes a dicing tape having an attachment region extending along an outer circumference thereof so as to be attached to a ring frame used when dicing a wafer, an adhesive film on the dicing tape radially inside of an inner boundary of the attachment region and to which the wafer is bonded, and an incision pattern portion within the attachment region and including first incision patterns that are spaced apart from each other along a first concentric circle having a first radius and second incision patterns that are spaced apart from each other along a second concentric circle having a second radius greater than the first radius. Each of the first incision patterns has a convex arch shape toward a center of the dicing tape, and each of the second incision patterns has a convex arch shape toward an outside of the dicing tape.

19 Claims, 11 Drawing Sheets

(56) References Cited

U.S. PATENT DOCUMENTS

| | | | | |
|---|---|---|---|---|
| 2015/0017374 | A1* | 1/2015 | Aoyama | C09J 133/08 428/41.8 |
| 2022/0340788 | A1* | 10/2022 | Nishikawa | C09J 7/20 |
| 2022/0348795 | A1* | 11/2022 | Uemura | C09J 7/20 |

FOREIGN PATENT DOCUMENTS

| | | | | |
|---|---|---|---|---|
| JP | 2010-192856 | A | 9/2010 | |
| JP | 5857768 | B1 | 2/2016 | |
| JP | 2019-201037 | A | 11/2019 | |
| WO | WO-2020261709 | A1 * | 12/2020 | C09J 7/29 |

* cited by examiner

ADHESIVE TAPE SHEET, METHOD OF MANUFACTURING THE SAME AND METHOD OF MANUFACTURING SEMICONDUCTOR DEVICES USING THE SAME

CROSS-REFERENCE TO RELATED APPLICATION

This application is based on and claims priority under 35 U.S.C. § 119 to Korean Patent Application No. 10-2022-0112780, filed on Sep. 6, 2022 in the Korean Intellectual Property Office, the contents of which are herein incorporated by reference in their entirety.

BACKGROUND

1. Field

Example embodiments relate to an adhesive tape sheet, a method of manufacturing the same and a method of manufacturing semiconductor devices using the same. More particularly, example embodiments relate to an adhesive tape sheet used when dicing a wafer into individual semiconductor chips, a method of manufacturing the same and a method of manufacturing semiconductor devices using the same.

2. Description of Related Art

In a wafer dicing process, a dicing tape is attached to a wafer ring frame, and a semiconductor wafer is cut together with an adhesive film in a state supported by the adhesive film on the dicing tape to be individualized, and in a subsequent die bonding process, the individualized semiconductor chip may be picked up with the adhesive film and attached onto a package substrate such as a PCB or another semiconductor chip. The dicing tape requires high adhesive strength with the wafer ring frame, but due to this high adhesive strength, after the dicing process is performed, the dicing tape may be torn when removed from the ring frame and may remain on the ring frame, thereby causing defects in subsequent processes.

SUMMARY

Example embodiments provide an adhesive tape sheet having a dicing tape capable of preventing defects in a wafer dicing process.

Example embodiments provide a method of manufacturing the adhesive tape sheet.

Example embodiments provide a method of manufacturing a semiconductor device using the adhesive tape sheet.

In accordance with an aspect of the disclosure, an adhesive tape sheet includes a dicing tape including an attachment region, the attachment region extending along an outer circumference of the dicing tape so as to be attached to a ring frame used when dicing a wafer; an adhesive film on the dicing tape radially inside of an inner boundary of the attachment region and to which the wafer is bonded; and an incision pattern portion within the attachment region, the incision pattern portion including first incision patterns that are spaced apart from each other along a first concentric circle having a first radius and second incision patterns that are spaced apart from each other along a second concentric circle having a second radius greater than the first radius, the first incision patterns and the second incision patterns penetrating the dicing tape, wherein each of the first incision patterns has a convex arch shape toward a center of the dicing tape, and each of the second incision patterns has a convex arch shape toward an outside of the dicing tape.

In accordance with an aspect of the disclosure, an adhesive tape sheet includes a dicing tape including an attachment region that extends along an outer circumference of the dicing tape; an adhesive film on the dicing tape radially inside of an inner boundary of the attachment region; adhesive force increasing patterns within the attachment region of the dicing tape to be spaced apart from each other along a circumferential direction; and crack preventing patterns within the attachment region of the dicing tape to be spaced apart from each other along the circumferential direction, the crack preventing patterns being outside the adhesion increasing patterns in a radial direction, wherein when viewed in the radial direction, each crack preventing pattern extends in the circumferential direction by a predetermined length so as to overlap one end portions of adhesive force increasing patterns adjacent to each other.

In accordance with an aspect of the disclosure, an adhesive tape sheet includes a release film extending in one direction and provided in a roll form; an adhesive film provided on the release film and having a circular shape; a dicing tape covering the adhesive film on the release film, the dicing tape including a peripheral region protruding outward from the adhesive film, the dicing tape further including a circular-shaped tacky material layer and a base film covering the tacky material layer and having a same shape as the tacky material layer; first incision patterns in an attachment region bonded to a ring frame as a portion of the peripheral region of the dicing tape, the first incision patterns being spaced apart along a first concentric circle having a first radius, the first incision patterns penetrating the dicing tape; and second incision patterns provided in the attachment region of the dicing tape, the second incision patterns being spaced apart from each other along a second concentric circle having a second radius greater than the first radius, the second incision patterns penetrating the dicing tape, wherein each of the first incision patterns has a convex arch shape toward a center of the dicing tape, and each of the second incision patterns has a convex arch shape toward an outside of the dicing tape.

According to example embodiments, an adhesive tape sheet may include a dicing tape having an attachment region, the attachment region extending along an outer circumference so as to be attached to a ring frame used when dicing a wafer, an adhesive film disposed inside the attachment region on the dicing tape and to which the wafer is bonded, first incision patterns arranged within the attachment region to be spaced apart from each other along a first concentric circle having a first radius, and second incision patterns arranged within the attachment region to be spaced apart from each other along a second concentric circle having a second radius greater than the first radius, the first and second incision patterns penetrating the dicing tape.

Each of the first incision patterns may have a convex arch shape toward the center of the dicing tape, and each of the second incision patterns may have a convex arch shape toward the outside of the dicing tape. When viewed in a radial direction, the second incision pattern may extend in a circumferential direction by a predetermined length so as to overlap one end portions of the first incision patterns adjacent to each other.

The first incision patterns may serve as adhesive force increasing patterns for reinforcing the adhesive force of the dicing tape in order to prevent the dicing tape from being separated from the ring frame when the dicing tape expands during a dicing process. The second incision patterns may serve as crack preventing patterns in order to prevent the progress of cracks from the first incision patterns when the dicing tape is removed from the ring frame after the dicing process.

Accordingly, the adhesive force of the dicing tape may be reinforced by the first incision patterns, and the dicing tape may be completely removed without any residue by the second incision patterns. Thus, the dicing tape may be preventing from being torn, to thereby prevent a cost increase due to a defect occurring in a subsequent process.

BRIEF DESCRIPTION OF DRAWINGS

Example embodiments will be more clearly understood from the following detailed description taken in conjunction with the accompanying drawings.

FIG. 1 is a plan view illustrating an adhesive tape sheet in accordance with example embodiments.

FIG. 2 is a cross-sectional view taken along the line A-A' in FIG. 1.

FIG. 3 is a view illustrating an apparatus for performing a roll process to manufacture an adhesive tape sheet in accordance with example embodiments.

FIGS. 4 and 5 are cross-sectional views illustrating a method of attaching an adhesive tape sheet to a ring frame.

FIG. 6 is a bottom view of FIG. 5.

FIG. 7 is an enlarged bottom view illustrating a portion of FIG. 6.

FIG. 8 is a plan view illustrating a portion of a dicing tape including first and second incision patterns formed therein in accordance with example embodiments.

FIG. 9 is an enlarged plan view illustrating a portion of FIG. 8.

FIG. 10 is a plan view illustrating a portion of a dicing tape including first and second incision patterns formed therein in accordance with example embodiments.

FIG. 11 is a plan view illustrating a portion of a dicing tape including first and second incision patterns formed therein in accordance with example embodiments.

FIG. 12 is a plan view illustrating a portion of a dicing tape including first and second incision patterns formed therein in accordance with example embodiments.

FIG. 13 is a plan view illustrating a portion of a dicing tape including first and second incision patterns formed therein in accordance with example embodiments.

FIGS. 14 to 18 are views illustrating a method of manufacturing a semiconductor device using an adhesive tape sheet in accordance with example embodiments.

DETAILED DESCRIPTION

Hereinafter, example embodiments will be explained in detail with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
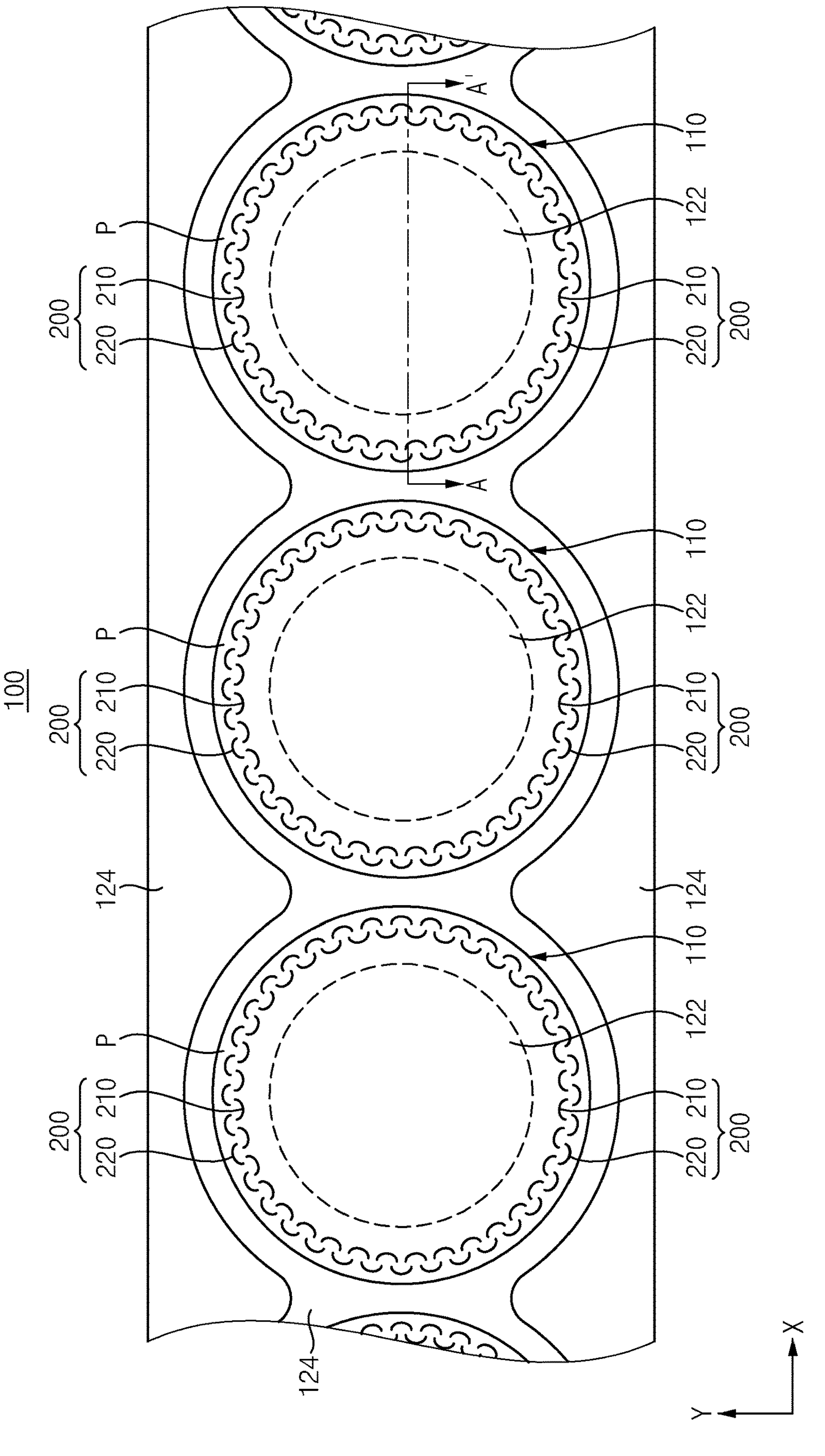
FIGS. 1 to 18 represent non-limiting, example embodiments as described herein.
Figure 2:
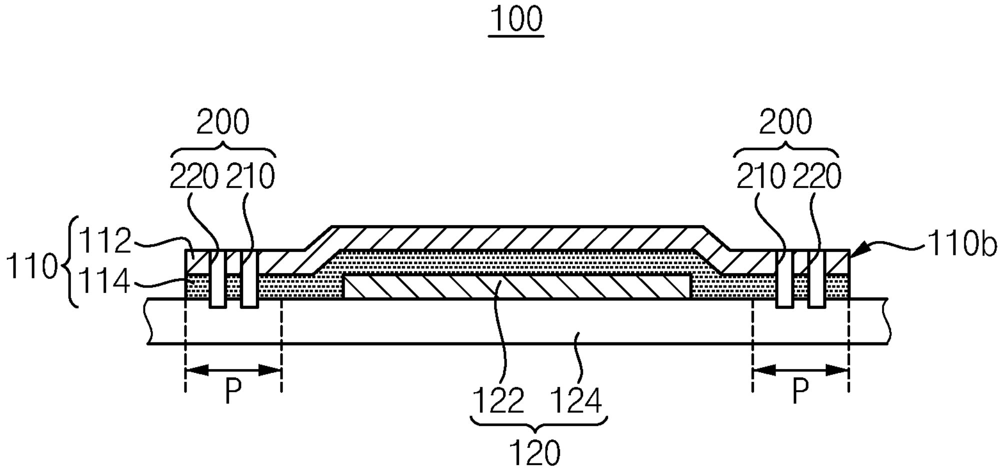

FIG. 1 is a plan view illustrating an adhesive tape sheet in accordance with example embodiments. FIG. 2 is a cross-sectional view taken along the line A-A' in FIG. 1.

Referring to FIGS. 1 and 2, an adhesive tape sheet 100 may include a dicing tape 110, an adhesive film 122 provided on the dicing tape 110, and an incision pattern portion 200 formed in an attachment region P of the dicing tape 110. Additionally, the adhesive tape sheet 100 may further include a release film 124 that covers the adhesive film 122 on the dicing tape 110. The dicing tape 110 may include a base film 112 and a tacky material layer 114 provided on the base film 112.

In example embodiments, the adhesive tape sheet 100 may be a long tape used for dicing a semiconductor wafer and bonding semiconductor chips individually divided by dicing, and may be generally wound into a roll. As will be described later, in a dicing process using the dicing tape 110, the semiconductor wafer may be cut together with the adhesive film 122 in a state supported by the adhesive film 122 to be individualized, and in a following die bonding process, the individualized semiconductor chip may be picked up together with the adhesive film 122 and attached to a package substrate such as PCB or another semiconductor chip.

As illustrated in FIG. 1, the release film 124 may extend in one direction (e.g., the X direction). On one surface of the release film 124, adhesive films 122 having a circular shape corresponding to a shape of the semiconductor wafer may be arranged to be spaced apart from each other along the extending direction of the release film 124. The tacky material layer 114 having a circular shape may be formed on the release film 124 to cover the adhesive film 122 and the base film 112 may be formed on the tacky material layer 114. The base film 112 may have a circular shape the same as the tacky material layer 114.

For example, the release film 124 may include a resin such as polyethylene terephthalate (PET) or polytetrafluoroethylene (PTFE) (Teflon). The adhesive film 122 may include a die attach film (DAF) as an organic adhesive. The tacky material layer 114 may include pressure sensitive adhesive (PSA). The tacky material layer 114 may include an acrylic adhesive. The tacky material layer 114 may be a pressure-sensitive (non-UV type) adhesive. Alternatively, the tacky material layer 114 may be a UV curable (UV type) adhesive. The base film 112 may include a polyolefin (PO) film.

As illustrated in FIG. 2, the dicing tape 110 may have an attachment region P that is attached to one surface of a ring frame in the dicing process. Since the dicing tape 110 has a larger planar area than the adhesive film 122, a peripheral region of the dicing tape 110 may protrude outward from the adhesive film 122. A portion of the peripheral region of the dicing tape 110 may serve as the attachment region P attached to one surface of the ring frame.

In example embodiments, the incision pattern portion 200 may be provided in the attachment region P of the dicing tape 110 and may have a plurality of incision portions that penetrate the dicing tape 110. The incision pattern portion 200 may include first and second incision patterns 210 and 220 spaced apart from each other along first and second concentric circles having different radii (see, e.g., FIG. 1).

The first incision patterns 210 may be spaced apart from each other in a circumferential direction within the attachment region P of the dicing tape 110. The second incision patterns 220 may be spaced apart from each other in the circumferential direction within the attachment region P of the dicing tape 110 and may be arranged outside the first incision patterns 210.

Each of the first incision patterns 210 may have a convex arch shape toward the center of the dicing tape 110, and each of the second incision patterns 220 may have a convex arch shape toward the outside of the dicing tape 110.

The first incision patterns 210 may be spaced apart from each other by a predetermined first distance and the second incision patterns 220 may be spaced apart from each other by a predetermined second distance. The number of the first incision patterns 210 may be the same as the number of the second incision patterns 220. For example, the number of the first incision patterns 210 may be within a range of 100 to 150.

The first and second incision patterns 210 and 220 may be arranged alternately to cross each other or in a zigzag along the circumferential direction. When viewed in the radial direction, the second incision patterns 220 may extend by a predetermined length in the circumferential direction so as to overlap end portions of the first incision patterns 210 adjacent to each other. The distance between adjacent first incision patterns 210 may be equal to or smaller than the length of the second incision pattern 220 in the circumferential direction.

The first incision patterns 210 may be provided as adhesive force increasing patterns for reinforcing adhesive force in order to prevent the dicing tape 110 from lifting off from the ring frame during the dicing process. The second incision patterns 220 may be provided as crack preventing patterns in order to prevent cracks from progressing from the first incision patterns 210 and reaching to an outer circumferential portion **110*b* of the dicing tape 110 when the dicing tape 110** is removed from the ring frame after the dicing process. Detailed configurations of the first and second incision patterns will be described later.

Hereinafter, a method of manufacturing the adhesive tape sheet will be described.

Figure 3:
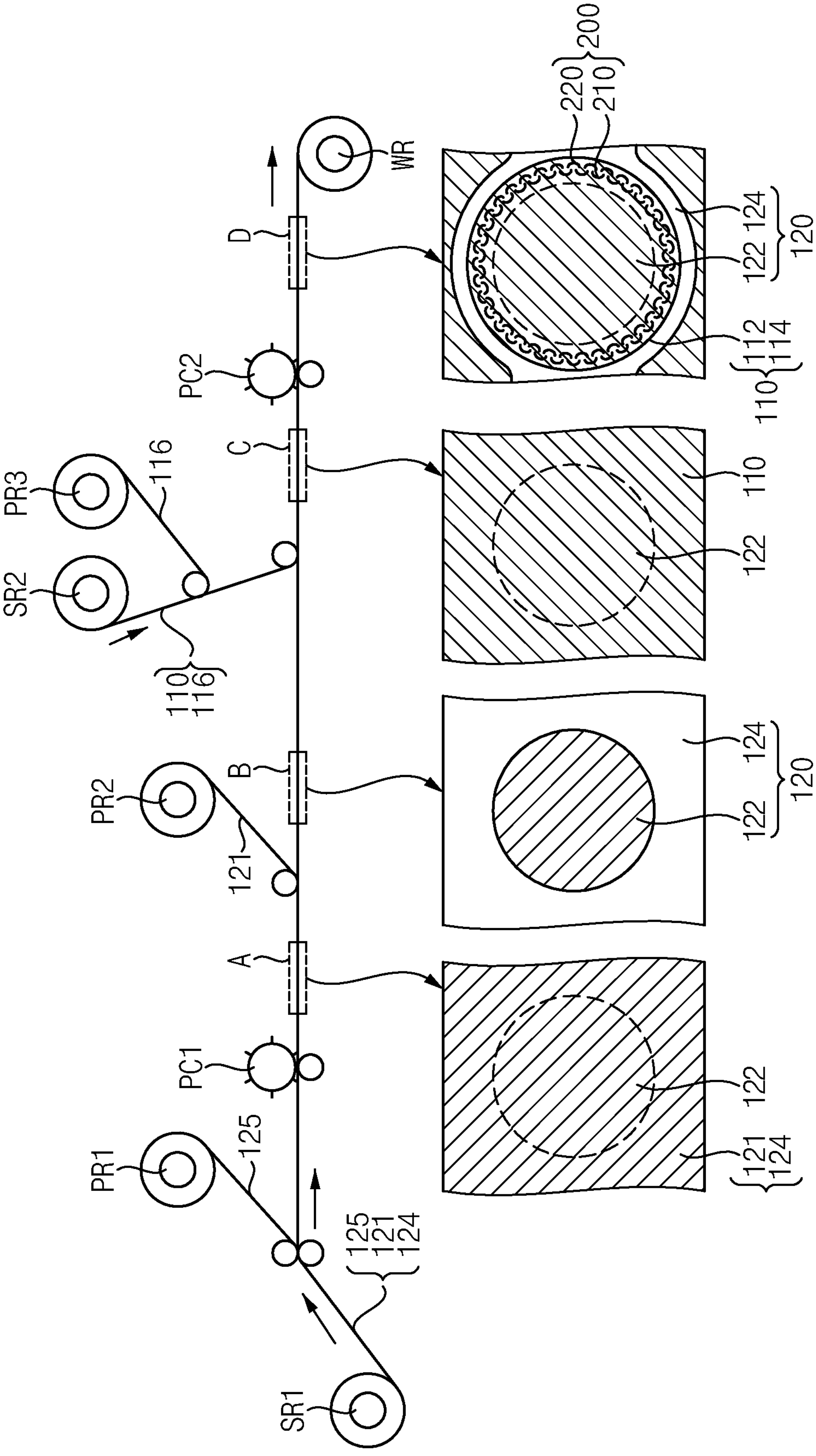

FIG. 3 is a view illustrating an apparatus for performing a roll process to manufacture an adhesive tape sheet in accordance with example embodiments.

Referring to FIG. 3, a film laminate of a release film 124, an adhesive layer 121 coated on the release film 124 and an upper release film 125 laminated on the adhesive layer 121 may be provided by a first feeding roller SR1, and the film laminate from which the upper release film 125 is removed may be provided by a first peeling roller PR1.

Then, a circular pre-cut process may be performed using a half pinnacle PC1 on the film laminate to form a circular adhesive film 122 on the adhesive layer 121 (see the plan view of portion ‘A’), and unnecessary portions of the adhesive layer 121 may be removed by a second peeling roller PR2 to from an adhesive film 122 on the release film 124 (see the plan view of portion 13').

Then, a tape stack of a dicing tape 110 and an upper release film 116 may be provided by a second feeding roller SR2, the upper release film 116 may be removed by a third peeling roller PR3 to provide the dicing tape 110, and the dicing tape 110 including a base film 112 and a tacky material layer 114 stacked on each other may be laminated on the release film 124 to cover the adhesive film 122 (see the plan view of section ‘C’).

Then, a circular pre-cut process may be performed on the dicing tape 110 to remove unnecessary portions of the dicing tape 110, and a pattern forming pre-cut process may be performed using a patterning pinnacle PC2 to form an incision pattern portion 200 including first and second incision patterns 210 and 220 formed in an attachment region P of the dicing tape 110 (see the plan view of portion ‘D’).

An adhesive tape sheet in which the incision pattern portion 200 is formed may be provided in a roll form by being wound around a winding roller WR.

Hereinafter, a method of attaching the adhesive tape sheet to the ring frame will be described.

Figure 4:
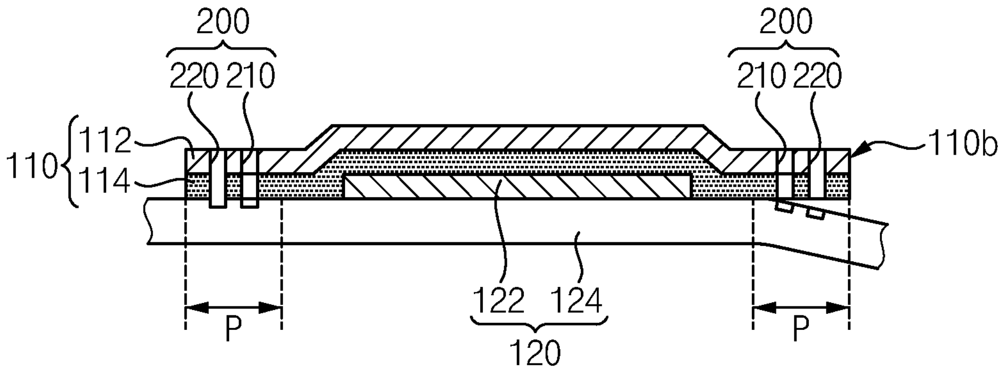
Figure 5:
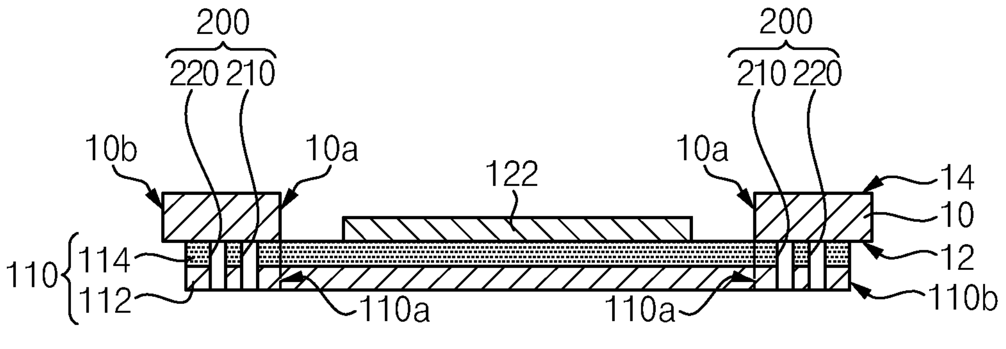
Figure 6:
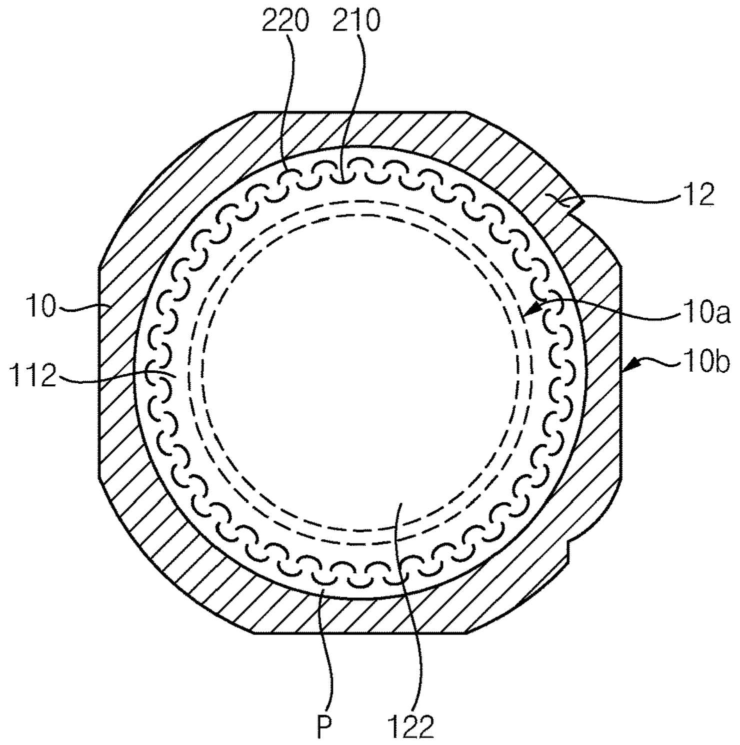
Figure 7:
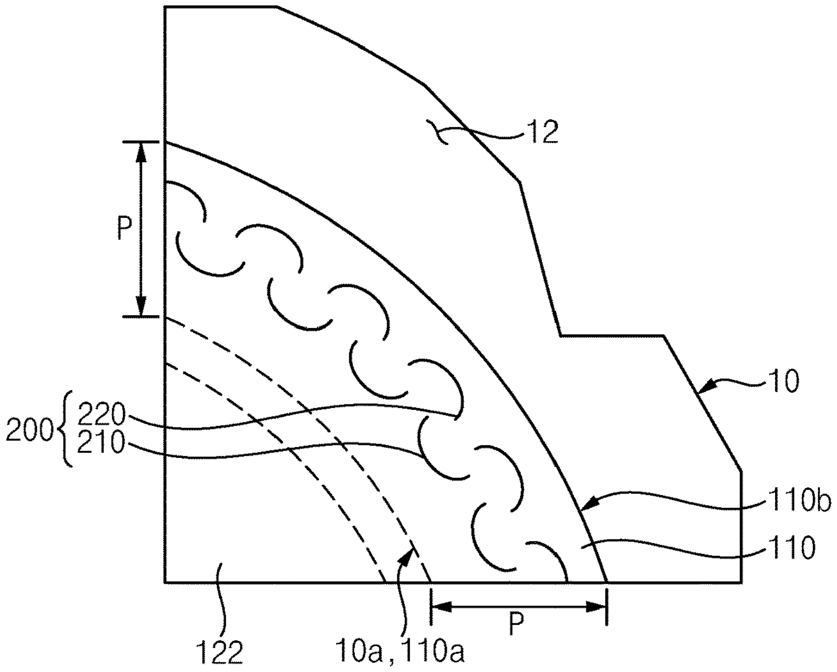

FIGS. 4 and 5 are cross-sectional views illustrating a method of attaching an adhesive tape sheet to a ring frame. FIG. 6 is a bottom view of FIG. 5. FIG. 7 is an enlarged bottom view illustrating a portion of FIG. 6.

Referring to FIGS. 4 to 7, first, the release film 124 may be peeled off from the adhesive tape sheet, and the dicing tape 110 may be attached to a lower surface 12 of a ring frame 10.

As illustrated in FIG. 4, as the release film 124 is peeled off, the adhesive film 122 on the tacky material layer 114 may be exposed to the outside.

As illustrated in FIGS. 5 and 6, the attachment region P of the dicing tape 110 may be attached to the lower surface 12 of the ring frame 10. The dicing tape 110 may be attached to the ring frame 10 by an adhesive force of the tacky material layer 114. The ring frame 10 may have an inner surface **10*a* defining an accommodation space therein and an outer surface 10*b* opposite to the inner surface 10*a* in a radial direction. The adhesive film 122 on the tacky material layer 114 of the dicing tape 110 may be disposed in the accommodation space of the ring frame 10. The adhesive film 122 may be spaced apart from the inner surface 10*a* of the ring frame 10**.

When viewed from a plan view, the attachment region P of the dicing tape 110 may be a region between an outer circumferential portion **110*b* of the dicing tape 110 and a portion corresponding (or overlapping) the inner surface 10*a* of the ring frame 10. The portion of the dicing tape 110 corresponding to the inner surface 10*a* of the ring frame 10 may be referred to as an attachment boundary portion 110*a* (see, e.g., FIG. 5). Accordingly, the attachment region P of the dicing tape 110 may be a region between the attachment boundary portion 110*a* and the outer peripheral portion 110*b* of the dicing tape 110**.

As illustrated in FIG. 7, the first and second incision patterns 210 and 220 may be arranged within the attachment region P of the dicing tape 110. The first and second incision patterns 210 and 220 may extend from a non-tacky surface of the dicing tape 110, that is, a lower surface of the base film 112, to a tacky surface of the dicing tape 110, that is, an upper surface of the tacky material layer 114. The adhesive film 122 may be disposed inside the attachment boundary portion 110*a* of the dicing tape 110. In other words, the adhesive film 122 may be disposed in a center region of the dicing tape 110 that is radially within a ring defined by the attachment boundary portion 110*a*.

Hereinafter, detailed configurations of the first and second incision patterns of the adhesive tape sheet will be described.

Figure 8:
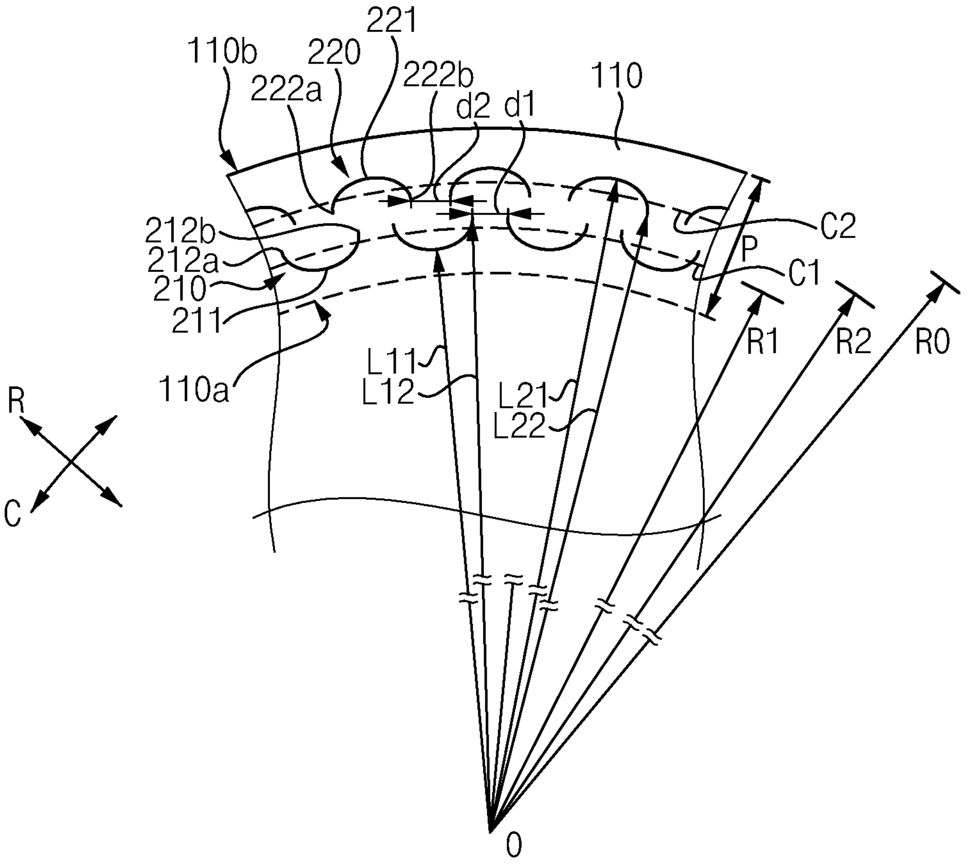
Figure 9:
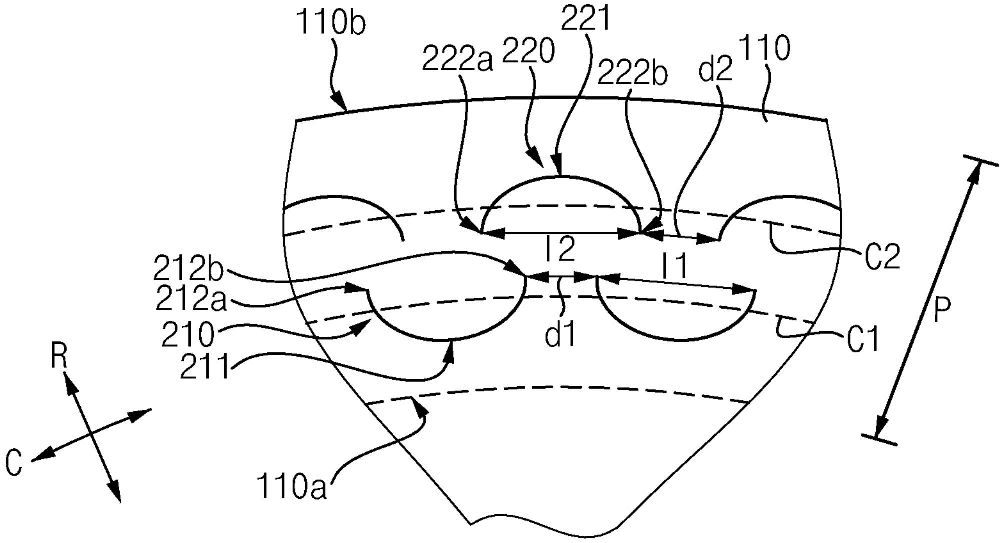

FIG. 8 is a plan view illustrating a portion of a dicing tape including first and second incision patterns formed therein in accordance with example embodiments. FIG. 9 is an enlarged plan view illustrating a portion of FIG. 8.

Referring to FIGS. 8 and 9, first and second incision patterns 210 and 220 may be arranged within an attachment region P between an attachment boundary portion 110*a* and an outer circumferential portion 110*b* of the dicing tape 110 to be spaced apart from each other along a circumferential direction C. The first incision patterns 210 may be spaced apart from each other in the circumferential direction within the attachment region P of the dicing tape 110. The second incision patterns 220 may be spaced apart from each other in the circumferential direction within the attachment region P of the dicing tape 110 and may be disposed outside the first incision patterns 210.

The first incision patterns 210 may be arranged at equal intervals along a first concentric circle C1. The second incision patterns 220 may be arranged at equal intervals along a second concentric circle C2. The first concentric circle C1 may have a first radius R1 from the center O of the dicing tape 110, and the second concentric circle C2 may have a second radius R2 greater than the first radius R1 from the center O of the dicing tape 110. The second radius R2 may be smaller than a radius R0 of the dicing tape 110.

For example, the radius R0 of the dicing tape 110 may be within a range of 175 mm to 187 mm. A length in a radial direction R of the attachment region P may be within a range of 10 mm to 20 mm.

Each of the first incision patterns 210 may have a convex arch shape toward the center of the dicing tape 110, and each of the second incision patterns 220 may have a convex arch shape toward the outside of the dicing tape 110. A width w1 (e.g., a length l1 in the circumferential direction C) of the first incision pattern 210 may be the same as or different from a width w2 (e.g., a length l2 in the circumferential direction C) of the second incision pattern 220. For example, the widths w1 and w2 of the first and second incision patterns 210 and 220 may be within a range of 5 mm to 15 mm.

The first incision pattern 210 may include a convex-shaped first central portion 211 and first and second end portions 212*a* and 212*b* that define respective ends of the first central portion 211. The first central portion 211 may be spaced apart from the center O of the dicing tape 110 by a first distance L11, and the first and second end portions 212*a* and 212*b* may be spaced apart from the center O of the dicing tape 110 by a second distance L12. The second distance L12 may be greater than the first distance L11.

The second incision pattern 220 may include a convex-shaped second central portion 221 and third and fourth end portions 222*a* and 222*b* that define respective ends of the second central portion 222. The second central portion 221 may be spaced apart from the center O of the dicing tape 110 by a third distance L21, and the third and fourth end portions 222*a* and 222*b* may be spaced apart from the center O of the dicing tape 110 by a fourth distance L22. The third distance L21 may be greater than the fourth distance L22. For example, a difference (L21-L11) between the third distance L21 and the first distance L11 may be 12 mm or less.

The first incision patterns 210 may be spaced apart by a predetermined first spacing distance d1 and the second incision patterns 220 may be spaced apart by a predetermined second spacing distance d2. The spacing distance d1 between adjacent first incision patterns 210 in the circumferential direction C and the spacing distance d2 between adjacent second incision patterns 220 in the circumferential direction C may be the same as or different from each other. For example, the first and second spacing distances d1 and d2 may be within a range of 5 mm to 15 mm.

The first and second incision patterns 210 and 220 may be arranged alternately to cross each other or in a zigzag along the circumferential direction C. When viewed in the radial direction R, one end portion of the first incision pattern 210 and one end portion of the second incision pattern 220 adjacent to the first incision pattern 210 may at least partially overlap each other. When viewed in the radial direction R, the second incision pattern 220 may extend by the predetermined length w2 in the circumferential direction C so as to overlap end portions 212*a* and 212*b* of the first incision patterns 210 adjacent to each other. The spacing distance d1 between adjacent first incision patterns 210 may be smaller than the length in the circumferential direction C, i.e., the width w2 of the second incision pattern 220.

Figure 10:
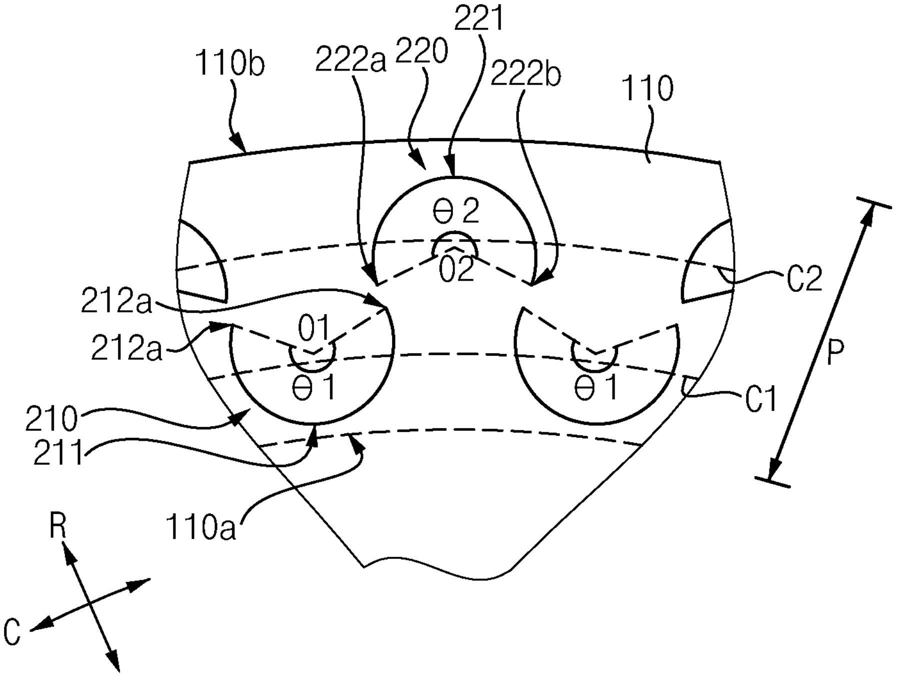

FIG. 10 is a plan view illustrating a portion of a dicing tape including first and second incision patterns formed therein in accordance with example embodiments.

Referring to FIG. 10, a first incision pattern 210 may extend in a curved shape to have an arc shape when viewed from a plan view. A second incision pattern 220 may extend in a curved shape to have an arc shape when viewed from a plan view. A central angle θ1 of the first incision pattern 210 may be the same as or different from a central angle θ2 of the second incision pattern 220. The central angles θ1 and θ2 of the first and second incision patterns 210 and 220 may be greater than 0 degree and less than 270 degrees.

The first incision pattern 210 may have a first radius of curvature, and the second incision pattern 220 may have a second radius of curvature. The first radius of curvature may be the same as or different from the second radius of curvature. The second radius of curvature of the second incision pattern 220 may be smaller than a radius of curvature R0 of the dicing tape 110.

Figure 11:
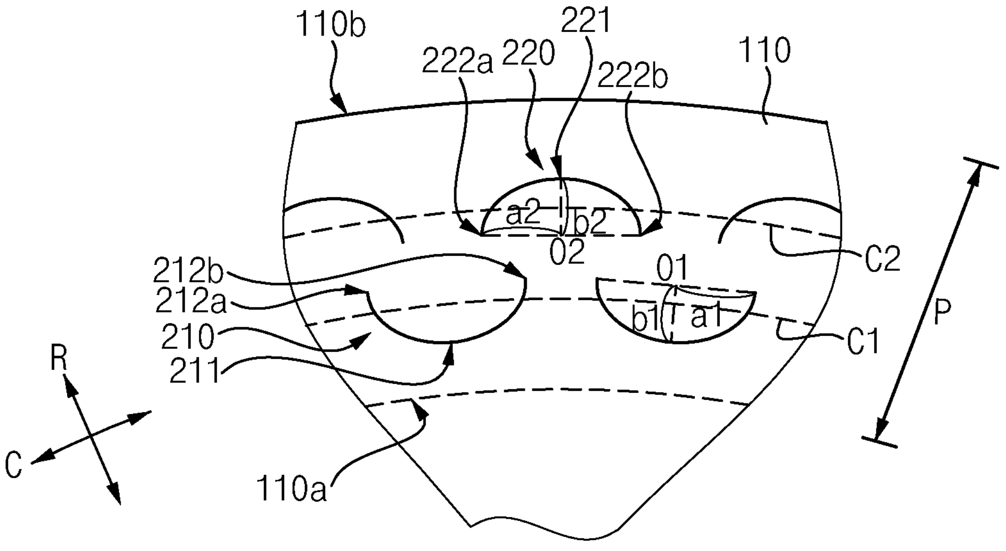

FIG. 11 is a plan view illustrating a portion of a dicing tape including first and second incision patterns formed therein in accordance with example embodiments.

Referring to FIG. 11, a first incision pattern 210 may extend in a curved shape to have a partial shape of an ellipse when viewed from a plan view. A second incision pattern 220 may extend in a curved shape to have a partial shape of an ellipse when viewed from a plan view. The first incision pattern 210 may have a first long radius (semi-major axis) a1 and a first short radius (semi-minor axis) b1. The second incision pattern 220 may have a second long radius a2 and a second short radius b2.

Alternatively, the first incision patterns 210 may extend in a curved shape to have an arc shape, and the second incision patterns 220 may extend in a curved shape to have a partial shape of an ellipse. Or, the first incision patterns 210 may extend in a curved shape to have a partial shape of an ellipse, and the second incision patterns 220 may extend in a curved shape to have an arc shape.

Figure 12:
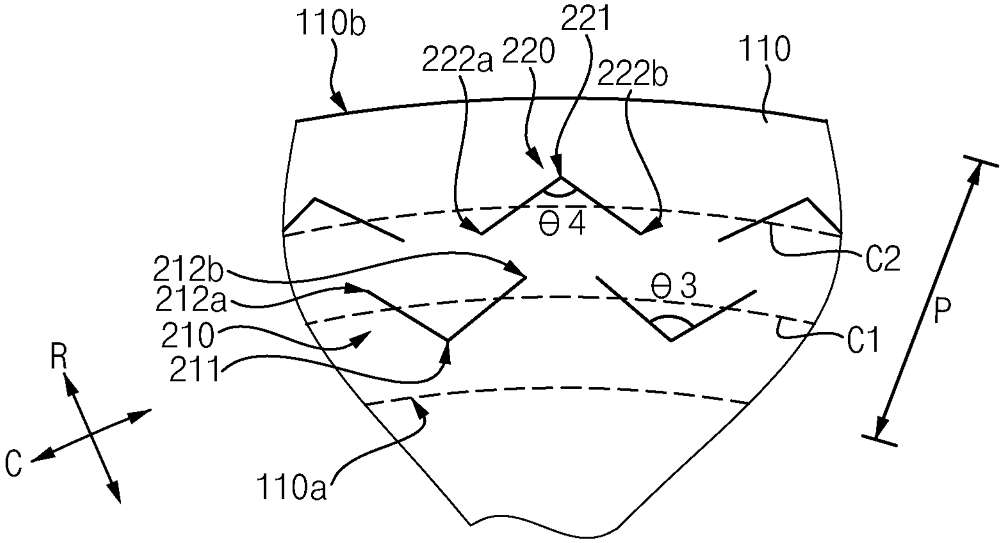

FIG. 12 is a plan view illustrating a portion of a dicing tape including first and second incision patterns formed therein in accordance with example embodiments.

Referring to FIG. 12, a first incision pattern 210 may include two line segment portions defining a third central angle θ3 when viewed from a plan view. One end portions of the two line segment portions meeting each other may form a convex-shaped first central portion 211 and other end portions of the two line segment portions may form first and second end portions 212*a* and 212*b*, respectively.

A second incision pattern 220 may include two line segment portions defining a fourth central angle θ4 when viewed from a plan view. One end portions of the two line segment portions meeting each other may form a convex-shaped second central portion 221 and other end portions of the two line segment portions may form third and fourth end portions 222*a* and 222*b*, respectively.

The central angles θ3 and θ4 of the first and second incision patterns 210 and 220 may be greater than 0 degree and less than 180 degrees.

Figure 13:
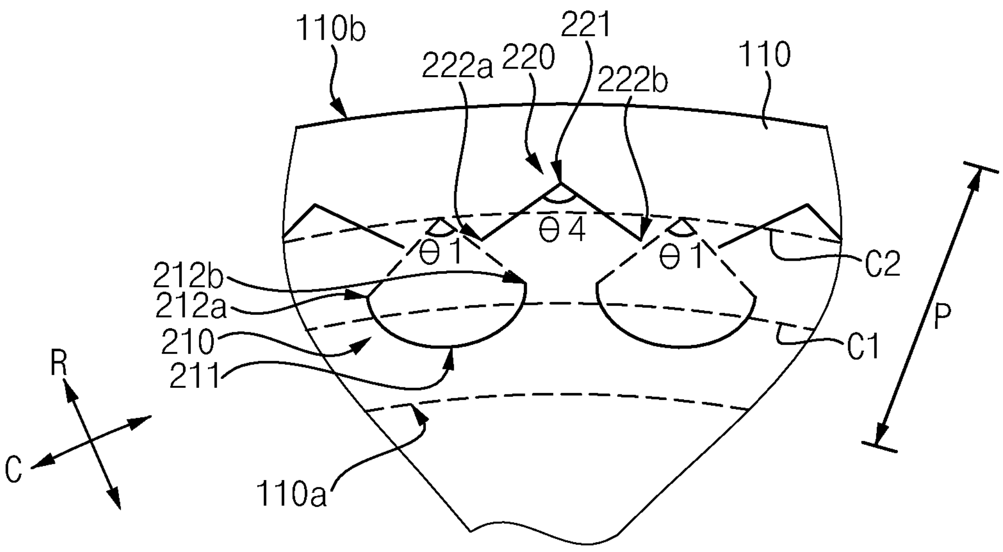

FIG. 13 is a plan view illustrating a portion of a dicing tape including first and second incision patterns formed therein in accordance with example embodiments.

Referring to FIG. 13, a first incision pattern 210 may extend in a curved shape to have an arc shape when viewed from a plan view. A central angle θ1 of the first incision pattern 210 may be greater than 0 degree and less than 270 degrees.

A second incision pattern 220 may include two line segment portions defining a fourth central angle θ4 when viewed from a plan view. One end portions of the two line segment portions meeting each other may form a convex-shaped second central portion 221 and other end portions of the two line segment portions may form third and fourth end portions 222*a* and 222*b*, respectively. The central angle θ4 of the second incision pattern 220 may be greater than 0 degrees and less than 180 degrees.

Alternatively, the first incision pattern 210 may include two line segment portions defining a third central angle, and the second incision pattern 220 may extend in a curved shape to have an arc shape or a partial shape of an ellipse.

Although only a few first and second incision patterns are illustrated in the figures, the number, shape, and arrangement of the first and second incision patterns are provided as examples, and it may be understood that it is not limited thereto. The number, shape, and arrangement of the first and second incision patterns may be determined in consideration of the peel strength and the materials of the dicing tape, the attaching area with the ring frame, the area and thickness of the adhesive film, etc.

Hereinafter, a method of manufacturing a semiconductor device using the adhesive tape sheet will be described.

FIGS. 14 to 18 are views illustrating a method of manufacturing a semiconductor device using an adhesive tape sheet in accordance with example embodiments.

Figure 14:
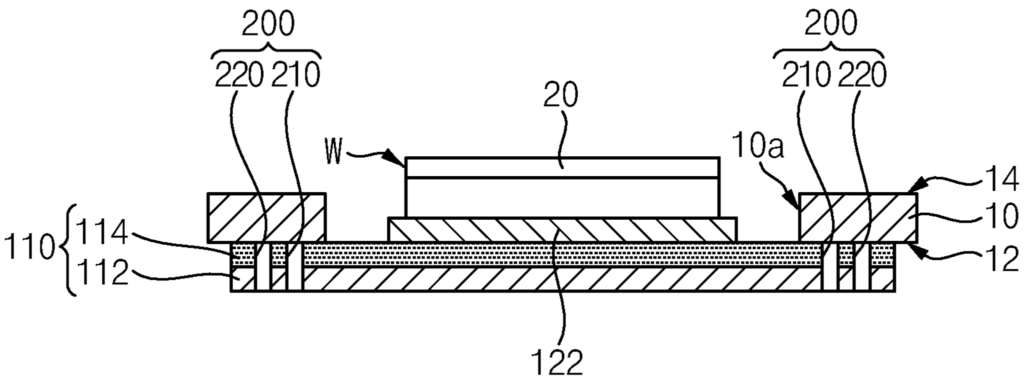

Referring to FIG. 14, a dicing tape 110 may be attached to a lower surface 12 of the ring frame 10, and a semiconductor wafer W having a plurality of semiconductor chips formed therein may be attached on the adhesive film 122.

In example embodiments, processes the same as or similar to the processes described with reference to FIGS. 4 to 7 may be performed to attach a portion of a peripheral region of the dicing tape 110 to the lower surface 12 of the ring frame 10. The portion of the peripheral region attached to the lower surface 12 of the ring frame 10 may be referred to as an attachment region P. The attachment region P of the dicing tape 110 may be a region between an outer circumferential portion 110*b* of the dicing tape 110 and an inner surface 10*a* of the ring frame 10. The adhesive film 122 on a tacky material layer 114 of the dicing tape 110 may be disposed in the accommodation space of the ring frame 10. The adhesive film 122 may be spaced apart from the inner surface 10*a* of the ring frame 10.

On the other hand, after attaching a protective tape 20 for protecting circuit elements on a first surface (active surface) of the wafer W, a second surface (backside surface) opposite to the first surface of the wafer W may be grinded. After performing the grinding process, the second surface of the wafer W may be attached to the adhesive film 122. After performing the grinding process, the protective tape 20 may be removed from the wafer W.

Figure 15:
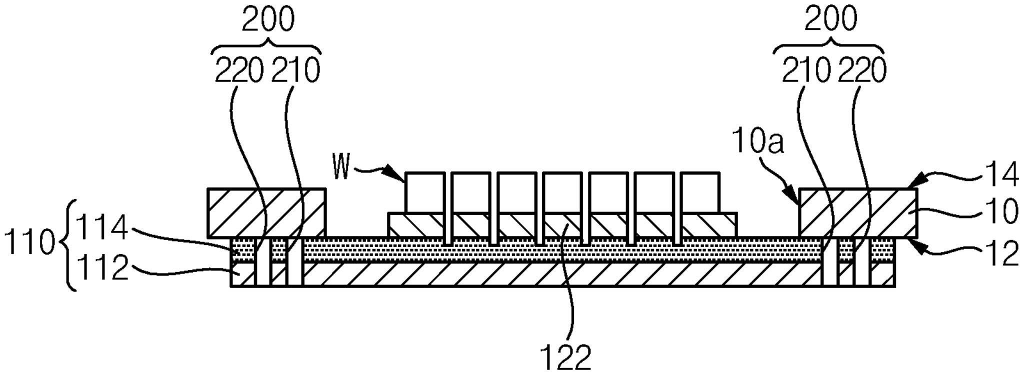

Referring to FIG. 15, a dicing process may be performed to form a cutting line for dividing the wafer W into a plurality of semiconductor chips. For example, the dicing process may be performed by irradiating a laser beam along a scribe lane region or using a blade.

Figure 16:
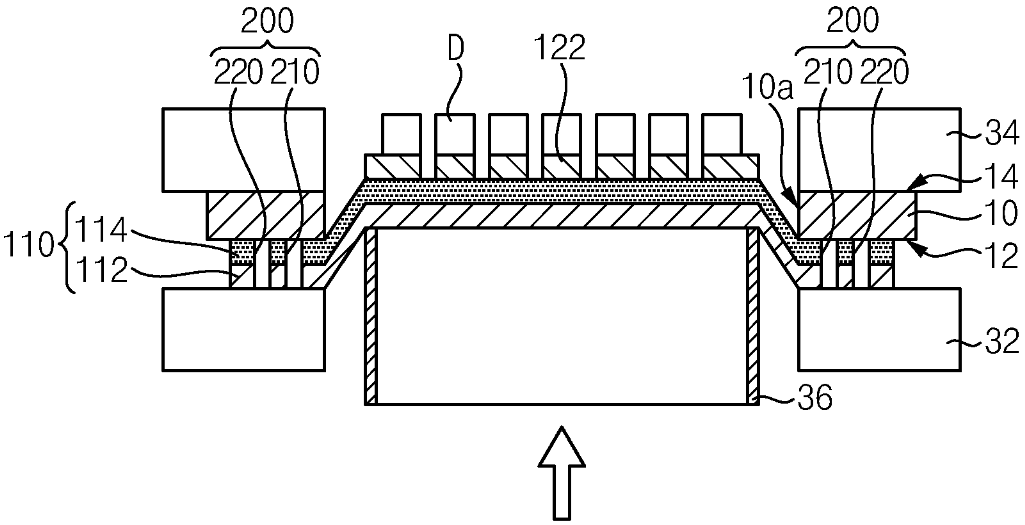

Referring to FIG. 16, the dicing tape 110 may be expanded to separate the wafer W into a plurality of semiconductor chips D.

In example embodiments, after the ring frame 10 and the attachment region P of the dicing tape 110 are inserted and fixed between a fixing member 34 and a stage 32, a cylindrical pressing member 36 may be raised to expand the adhesive tape sheet. Accordingly, the divided chips on the adhesive tape sheet may be spaced apart from each other in a radial direction. At this time, the adhesive film 122 may also be divided.

When the dicing tape 110 expands, the tacky material layer 114 needs to have sufficient adhesive strength so that the dicing tape 110 does not lift off from the ring frame 10. In particular, when the tacky material layer 114 includes a non-UV type adhesive, the adhesive strength may be somewhat low. The first incision patterns 210 may serve as adhesive force increasing patterns for reinforcing the adhesive force of the tacky material layer 114 in order to prevent the dicing tape 110 from being separated from the ring frame 10 when the dicing tape 110 expands.

Figure 17:
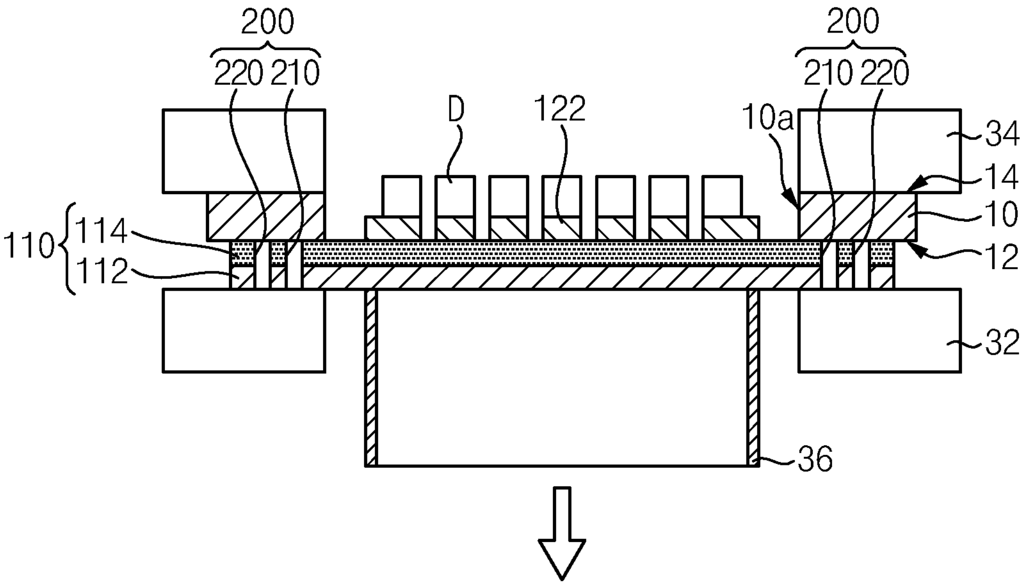

Referring to FIG. 17, the cylindrical pressing member 36 may be lowered and a pick-up process may be performed to pick up the individually separated semiconductor chips D. Accordingly, the semiconductor chip D to which the adhesive film 122 is attached may be attached onto a package substrate or another semiconductor chip to form a semiconductor package.

After performing the pick-up process, the dicing tape 110 may be removed from the ring frame. At this time, cracks may progress from the first incision patterns 210 and reach the outer circumferential portion 110*b* of the dicing tape 110, so a portion of the dicing tape is torn and remains as a foreign substance on the lower surface 12 of the ring frame 10. Since the ring frame 10 is a subsidiary material that is continuously used in subsequent processes, if the foreign substances remain, it may cause defects in the subsequent processes.

In example embodiments, the second incision patterns 220 may serve as crack preventing patterns in order to prevent the progress of cracks from the first incision patterns 210 to the outer circumferential portion 110*b* when the dicing tape 110 is removed from the ring frame 10 after the dicing process.

Figure 18:
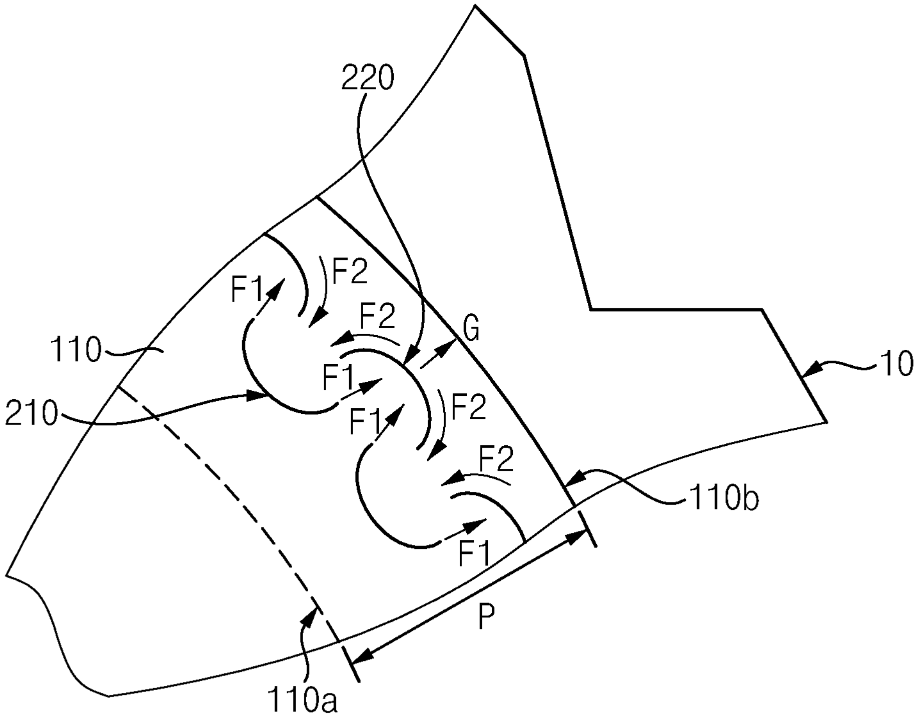

Referring to FIG. 18, when the dicing tape 110 is removed from the lower surface 12 of the ring frame 10, cracks may start from both end portions of the first incision pattern 210 in a direction F1, and cracks starting from one end portions of the adjacent incision patterns 210 may be merged and eventually proceed in a direction G to be torn. However, due to the shape of the second incision pattern 220, bi-directional forces may act in directions F2, respectively, so that cracks propagating from one end portions of the first incision patterns 210 may be stopped to prevent the dicing tape from being torn.

Accordingly, the adhesive force of the dicing tape 110 may be reinforced by the first incision patterns 210, and the dicing tape may be completely removed without any residue by the second incision patterns 210. Thus, by preventing the dicing tape from being torn, it is possible to prevent a cost increase due to a defect occurring in a subsequent process.

The semiconductor package formed by the above method may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the disclosure. Accordingly, all such modifications are intended to be included within the scope of example embodiments as defined in the claims.

What is claimed is:

1. An adhesive tape sheet, comprising:

a dicing tape comprising an attachment region, the attachment region extending along an outer circumference of the dicing tape;

an adhesive film on the dicing tape and radially inside of an inner boundary of the attachment region; and an incision pattern portion in the attachment region, the incision pattern portion comprising:

first incision patterns that are spaced apart from each other along a first concentric circle, the first concentric circle having a first radius; and second incision patterns that are spaced apart from each other along a second concentric circle, the second concentric circle having a second radius greater than the first radius, wherein the first incision patterns and the second incision patterns penetrate the dicing tape, wherein at least one first incision pattern of the first incision patterns has a convex arch shape toward a center of the dicing tape, and wherein at least one second incision pattern of the second incision patterns has a convex arch shape toward an outside of the dicing tape.

2. The adhesive tape sheet of claim 1, wherein the at least one first incision pattern comprises:

a convex-shaped first central portion, and a first end portion and a second end portion provided at respective ends of the convex-shaped first central portion, and wherein the at least one second incision pattern comprises;

a convex-shaped second central portion, and a third end portion and a fourth end portion provided at respective ends of the convex-shaped second central portion.

3. The adhesive tape sheet of claim 2, wherein the convex-shaped first central portion of the at least one first incision pattern is spaced apart from the center of the dicing tape by a first distance, and wherein the convex-shaped second central portion of the at least one second incision pattern is spaced apart from the center of the dicing tape by a second distance greater than the first distance.

4. The adhesive tape sheet of claim 3, wherein a difference between the second distance and the first distance is 12 mm or less.

5. The adhesive tape sheet of claim 1, wherein the first incision patterns and the second incision patterns are arranged alternately along a circumferential direction to overlap each other in a radial direction.

6. The adhesive tape sheet of claim 5, wherein when viewed in the radial direction, an end portion of the at least one first incision pattern at least partially overlaps an end portion of the at least one second incision pattern.

7. The adhesive tape sheet of claim 5, wherein, when viewed in the radial direction, the at least one second incision pattern overlaps, by a predetermined length in the circumferential direction, an end portion of the at least one first incision patterns.

8. The adhesive tape sheet of claim 5, wherein the at least one first incision pattern comprises a primary first incision pattern and a secondary first incision pattern that is adjacent to the primary first incision pattern, wherein a spacing distance between the primary first incision pattern and the secondary first incision pattern is the same as or smaller than a length of the at least one second incision pattern in the circumferential direction.

9. The adhesive tape sheet of claim 1, wherein when viewed from a plan view, the at least one first incision pattern and/or the at least one second incision pattern has at least one of a curved shape, an arc shape, or a partial shape of an ellipse.

10. The adhesive tape sheet of claim 1, further comprising:

a release film on the adhesive film on the dicing tape.

11. An adhesive tape sheet, comprising:

a dicing tape comprising an attachment region that extends along an outer circumference of the dicing tape;

an adhesive film on the dicing tape and radially inside of an inner boundary of the attachment region;

adhesive force increasing patterns in the attachment region and spaced apart from each other along a circumferential direction; and crack preventing patterns in the attachment region and spaced apart from each other along the circumferential direction, the crack preventing patterns being outside the adhesive force increasing patterns in a radial direction, wherein, when viewed in the radial direction, at least one crack preventing pattern of the crack preventing patterns overlaps, by a predetermined length in the circumferential direction, an end portion of at least one adhesive force increasing pattern of the adhesive force increasing patterns, wherein the at least one adhesive force increasing pattern has a convex arch shape toward a center of the dicing tape, and wherein the at least one crack preventing pattern has a convex arch shape toward an outside of the dicing tape.

12. The adhesive tape sheet of claim 11, wherein the adhesive force increasing patterns and the crack preventing patterns are arranged alternately along the circumferential direction to overlap each other in the radial direction.

13. The adhesive tape sheet of claim 12, wherein, when viewed in the radial direction, an end portion of the at least one adhesive force increasing pattern at least partially overlaps an end portion of the at least one crack preventing pattern.

14. The adhesive tape sheet of claim 12, wherein the at least one adhesive force increasing pattern comprises a first adhesive force increasing pattern and a second adhesive force increasing pattern that is adjacent to the first adhesive force increasing pattern, wherein a spacing distance between the first adhesive force increasing pattern and the second adhesive force increasing pattern is the same as or smaller than a length of the at least one crack preventing pattern in the circumferential direction.

15. The adhesive tape sheet of claim 11, wherein a length of the at least one crack preventing pattern in the circumferential direction is within a range of 5 mm to 15 mm.

16. The adhesive tape sheet of claim 11, wherein the at least one adhesive force increasing pattern comprises:

a convex-shaped first central portion, and a first end portion and a second end portion at respective ends of the convex-shaped first central portion, and wherein the at least one crack preventing pattern comprises:

a convex-shaped second central portion, and a third end portion and a fourth end portion at respective ends of the convex-shaped second central portion.

17. The adhesive tape sheet of claim 16, wherein the convex-shaped first central portion of the at least one adhesive force increasing pattern is spaced apart from the center of the dicing tape by a first distance, and wherein the convex-shaped second central portion of the at least one crack preventing pattern is spaced apart from the center of the dicing tape by a second distance greater than the first distance.

18. The adhesive tape sheet of claim 17, wherein a difference between the second distance and the first distance is 12 mm or less.

19. An adhesive tape sheet, comprising:

a release film extending in a first direction and in a roll form;

an adhesive film on the release film and having a circular shape;

a dicing tape on the adhesive film on the release film, the dicing tape comprising:

a peripheral region protruding outward from the adhesive film, a circular-shaped tacky material layer, and a base film on the circular-shaped tacky material layer and having a same shape as the circular-shaped tacky material layer;

first incision patterns in an attachment region of the peripheral region and penetrating the dicing tape, the first incision patterns being spaced apart from each other along a first concentric circle having a first radius, and second incision patterns in the attachment region and penetrating the dicing tape, the second incision patterns being spaced apart from each other along a second concentric circle having a second radius greater than the first radius, wherein at least one first incision pattern of the first incision patterns has a convex arch shape toward a center of the dicing tape, and wherein at least one second incision pattern of the second incision patterns has a convex arch shape toward an outside of the dicing tape.

* * * * *